US012575437B2

(12) United States Patent
Park et al.

(10) Patent No.: US 12,575,437 B2
(45) Date of Patent: Mar. 10, 2026

(54) REDISTRIBUTION SUBSTRATE, SEMICONDUCTOR PACKAGE INCLUDING THE SAME, AND METHOD OF FABRICATING REDISTRIBUTION SUBSTRATE

(71) Applicant: SAMSUNG ELECTRONICS CO., LTD., Suwon-si (KR)

(72) Inventors: Hyungjun Park, Suwon-si (KR); Gyuho Kang, Suwon-si (KR); Seong-Hoon Bae, Suwon-si (KR); Sang-Hyuck Oh, Suwon-si (KR); Kwangok Jeong, Suwon-si (KR); Ju-Il Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 363 days.

(21) Appl. No.: 18/208,415

(22) Filed: Jun. 12, 2023

(65) Prior Publication Data

US 2024/0213133 A1 Jun. 27, 2024

(30) Foreign Application Priority Data

Dec. 22, 2022 (KR) ........................ 10-2022-0181749
Feb. 15, 2023 (KR) ........................ 10-2023-0019927

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 23/49822* (2013.01);
(Continued)

(58) Field of Classification Search
CPC ............ H01L 23/5383; H01L 23/5384; H01L 23/5386; H01L 23/49838; H01L 23/4982; H01L 23/49827
See application file for complete search history.

(56) References Cited

U.S. PATENT DOCUMENTS 6,492,198 B2 12/2002 Hwang
6,770,971 B2 8/2004 Kouno et al.
(Continued)

FOREIGN PATENT DOCUMENTS

JP 2017-92308 A 5/2017
KR 10-1787840 B1 10/2017

*Primary Examiner* — David A Zarneke
(74) *Attorney, Agent, or Firm* — Sughrue Mion, PLLC

(57) ABSTRACT

A redistribution substrate includes first and second insulating layers; a wiring layer, and a metal layer. The wiring pattern includes a via portion penetrating the first insulating layer and a pad portion on the via portion, the pad portion extending onto an upper surface of the first insulating layer. The metal layer covers an upper surface of the wiring pattern. The second insulating layer is provided on the first insulating layer and covers the pad portion and the metal layer. The wiring pattern includes a first metal. The metal layer includes the first metal and a second metal. The metal layer includes a first portion vertically overlapping the pad portion, and a second portion surrounding the first portion, and a concentration of the first metal in the first portion of the metal layer is greater than a concentration of the first metal in the second portion of the metal layer.

14 Claims, 13 Drawing Sheets

(51) Int. Cl.
    *H01L 23/538*         (2006.01)
    *H05K 1/11*            (2006.01)
    *H05K 3/46*            (2006.01)

(52) U.S. Cl.
    CPC .... *H01L 23/49827* (2013.01); *H01L 23/5383* (2013.01); *H01L 23/5384* (2013.01); *H01L 23/5386* (2013.01); *H05K 1/113* (2013.01); *H05K 3/4644* (2013.01); *H05K 1/111* (2013.01); *H05K 1/112* (2013.01)

(56)            References Cited

U.S. PATENT DOCUMENTS

| | | | |
|---|---|---|---|
| 9,331,021 | B2 | 5/2016 | Yu et al. |
| 9,721,886 | B2 | 8/2017 | Lee et al. |
| 11,387,143 | B2 | 7/2022 | Cheng et al. |
| 2014/0061920 | A1 | 3/2014 | Hirano et al. |

FIG. 13

REDISTRIBUTION SUBSTRATE, SEMICONDUCTOR PACKAGE INCLUDING THE SAME, AND METHOD OF FABRICATING REDISTRIBUTION SUBSTRATE

CROSS-REFERENCE TO RELATED APPLICATIONS

This U.S. non-provisional patent application claims priority under 35 U.S.C. § 119 to Korean Patent Application No. 10-2022-0181749, filed on Dec. 22, 2022, and Korean Patent Application No. 10-2023-0019927, filed on Feb. 15, 2023, in the Korean Intellectual Property Office, the entire contents of which are hereby incorporated by reference.

BACKGROUND

The present disclosure relates to a redistribution substrate and a semiconductor package, and more particularly, relates to a redistribution substrate including a wiring pattern and a semiconductor package including the same.

A semiconductor package is provided to implement an integrated circuit chip for use in electronic products. Typically, a semiconductor package includes a semiconductor chip that is mounted on a printed circuit board (PCB) and bonding wires or bumps are used to electrically connect the semiconductor chip to the printed circuit board. With the development of the electronic industry, various research has been conducted to improve reliability and to reduce a size of the semiconductor packages.

SUMMARY

It is an aspect to provide a redistribution substrate having improved structural stability, a semiconductor package including the same, and a method of fabricating the redistribution substrate.

It is another aspect to provide a redistribution substrate having improved reliability, a semiconductor package including the same, and a method of fabricating the redistribution substrate.

According to one or more example embodiments, there is provided a redistribution substrate comprising a first insulating layer; a wiring pattern including a via portion penetrating the first insulating layer and a pad portion on the via portion, the pad portion extending onto an upper surface of the first insulating layer; a metal layer covering an upper surface of the wiring pattern; and a second insulating layer on the first insulating layer, the second insulating layer covering the pad portion and the metal layer, wherein the wiring pattern includes a first metal, wherein the metal layer includes the first metal and a second metal, wherein the metal layer includes a first portion vertically overlapping the pad portion; and a second portion surrounding the first portion, and wherein a concentration of the first metal in the first portion of the metal layer is greater than a concentration of the first metal in the second portion of the metal layer.

According to one or more example embodiments, there is also provided a semiconductor package comprising a first redistribution substrate; a semiconductor chip mounted on the first redistribution substrate; and a molding layer on an upper surface of the first redistribution substrate and covering the semiconductor chip. The first redistribution substrate includes a first insulating layer; a wiring pattern including a via portion penetrating the first insulating layer and a pad portion on the via portion, the pad portion extending onto an upper surface of the first insulating layer; a metal layer covering an upper surface of the wiring pattern; and a second insulating layer on the first insulating layer, the second insulating layer covering the pad portion and the metal layer. A width of the metal layer is greater than a width of the pad portion, and a thickness of the metal layer is 300 Å to 1500 Å.

According to one or more example embodiments, there is also provided a method comprising forming a first insulating layer on a substrate, the first insulating layer having a first opening; forming a photoresist pattern on the first insulating layer, the photoresist pattern having a second opening on the first insulating layer that is connected to the first opening; forming a wiring pattern filling the first opening and the second opening, the wiring pattern including a first metal; forming a metal layer on the wiring pattern, the metal layer including a second metal; removing the photoresist pattern; and forming a second insulating layer on the first insulating layer, the second insulating layer covering the wiring pattern and the metal layer.

BRIEF DESCRIPTION OF THE DRAWINGS

Example embodiments will be more clearly understood from the following brief description taken in conjunction with the accompanying drawings, which illustrate non-limiting, example embodiments as described herein.

FIGS. 13 to 16 are cross-sectional views illustrating a method of fabricating a semiconductor package according to some example embodiments.

DETAILED DESCRIPTION

Hereinafter, a redistribution substrate, a semiconductor package including the same, and a fabricating method of the redistribution substrate according to various example embodiments will be described with reference to the drawings.

Figure 1:
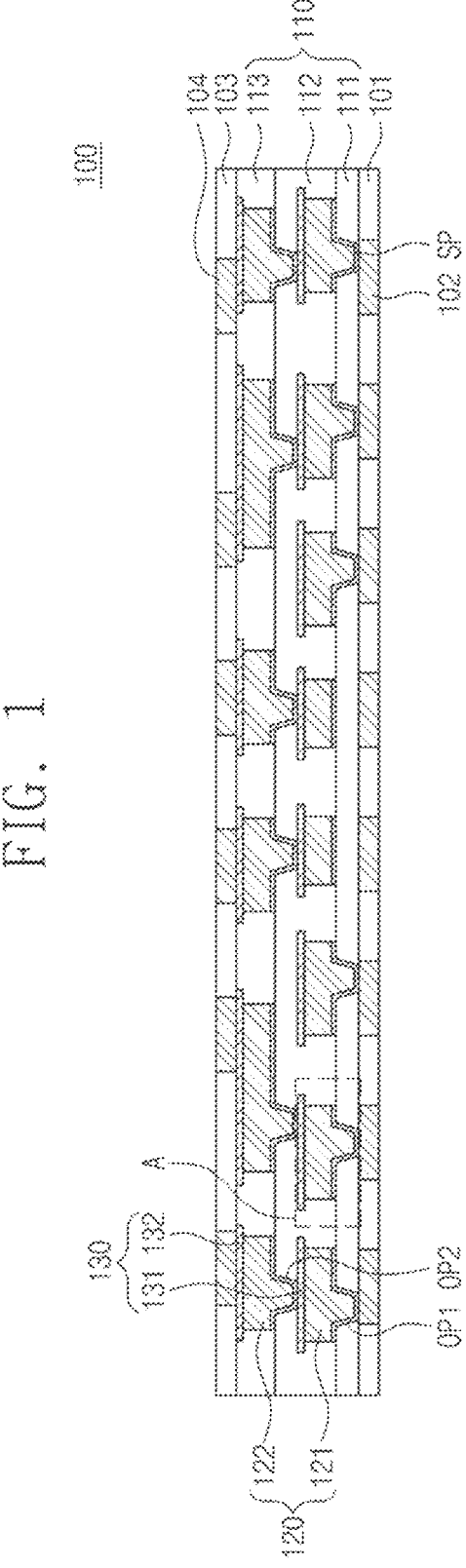
FIG. 1 is a cross-sectional view of a redistribution substrate according to some example embodiments.
Figure 2A:
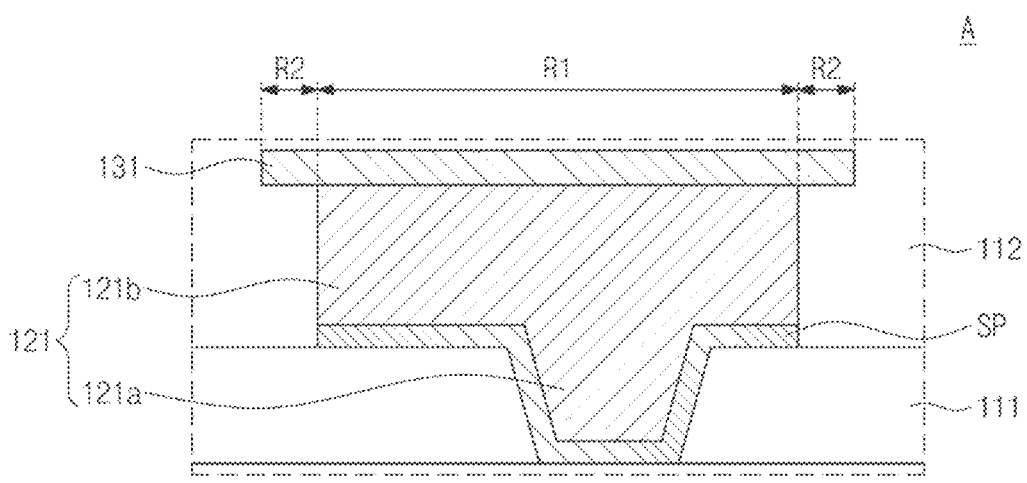
FIG. 2A is an enlarged view of region 'A' of FIG. 1.
Figure 2B:
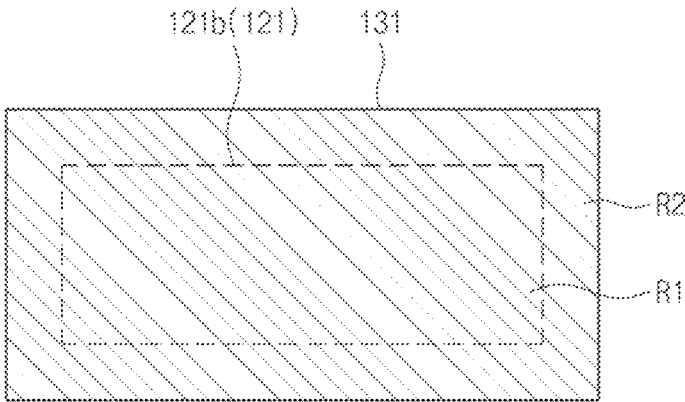
FIG. 2B is a plan view of a metal layer according to some example embodiments.

FIG. 1 is a cross-sectional view of a redistribution substrate according to some example embodiments. FIG. 2A is an enlarged view of region 'A' of FIG. 1. FIG. 2B is a plan view of a metal layer according to some example embodiments.

Referring to FIGS. 1, 2A, and 2B, a redistribution substrate 100 may include a first protective layer 101, a second protective layer 103, insulating layers 110, wiring patterns 120, and metal layers 130. The insulating layers 110 may include a first insulating layer 111, a second insulating layer 112, and a third insulating layer 113. The number of insulating layers 110 is not limited to that shown in FIG. 1, and in some example embodiments two or fewer or four or more insulating layers may be provided. The insulating layers 110 may include, for example, a photo-imageable dielectric (PID) material. The photo-imageable dielectric material may be a polymer. The photo-imageable dielectric material may include, for example, at least one of photosensitive polyimide, polybenzoxazole, phenol-based polymer, and benzocyclobutene-based polymer. In FIG. 1, an interface between the insulating layers 110 is shown for convenience of description, but in some example embodiments, the interface between adjacent insulating layers 110 may not be distinguished. The metal layers 130 may include a first metal layer 131 and a second metal layer 132. The wiring patterns 120 may include a first wiring pattern 121 and a second wiring pattern 122.

The first protective layer 101 may be provided on a lower surface of the redistribution substrate 100. The first protective layer 101 may include, for example, an insulating polymer.

A first redistribution pad 102 may be provided on the lower surface of the redistribution substrate 100. The first redistribution pad 102 may be surrounded by the first protective layer 101. In some example embodiments, the first protective layer 101 may completely cover side surfaces of the first redistribution pad 102 as illustrated in FIG. 1. A lower surface of the first redistribution pad 102 may be exposed from a lower surface of the first protective layer 101. In some example embodiments, the lower surface of the first redistribution pad 102 may be coplanar with the lower surface of the first protective layer 101. An upper surface of the first redistribution pad 102 may be exposed from an upper surface of the first protective layer 101. In some example embodiments, the upper surface of the first redistribution pad 102 may be coplanar with the upper surface of the first protective layer 101. The first redistribution pad 102 may be provided in plural. The first redistribution pads 102 may include a conductive material. For example, the first redistribution pad 102 may include copper, aluminum, and/or nickel.

The first insulating layer 111 may be provided on the first protective layer 101. The first insulating layer 111 may have a first opening OP1 connecting an upper surface and a lower surface of the first insulating layer 111. In some example embodiments, the first opening OP1 may have a narrower width toward the lower surface of the first insulating layer 111. The first opening OP1 in the first insulating layer 111 may expose at least a portion of the upper surface of the first redistribution pad 102.

The first wiring pattern 121 may be provided on the first insulating layer 111. The first wiring pattern 121 may include a first via portion 121a and a first pad portion 121b. The first wiring pattern 121 may include a first metal. The first metal may include, for example, copper (Cu).

The first via portion 121a may be provided in the first opening OP1. Accordingly, the first via portion 121a may have a narrower width toward the lower surface of the first insulating layer 111. The first via portion 121a may be a wiring pattern for vertical wiring within the redistribution substrate 100. The first via portion 121a may electrically connect the first redistribution pad 102 and the first pad portion 121b. The term 'Electrical connection/coupling' herein includes direct connection/coupling or indirect connection/coupling through another conductive component.

The first pad portion 121b may be provided on the first via portion 121a. The first pad portion 121b may extend onto the upper surface of the first insulating layer 111 on the first via portion 121a. The first pad portion 121b may electrically connect the first via portion 121a and a via portion of another wiring pattern adjacent to the first via portion 121a. The first pad portion 121b may be integrally connected to the first via portion 121a without an interface. A width of the first pad portion 121b may be greater than a width of the first via portion 121a. In some example embodiments, the width of the first pad portion 121b may be greater than a maximum width of the first via portion 121a. That is, the first wiring pattern 121 may have a T-shaped cross section.

Although not shown, the first wiring pattern 121 may further include a line portion horizontally connected to the first pad portion 121b. The line portion may be a wiring pattern for connecting a plurality of first pad portions 121b.

The first wiring pattern 121 may further include a seed pattern SP provided on a lower surface thereof. The seed pattern SP may cover a lower surface and a sidewall of the first via portion 121a and a lower surface of the first pad portion 121b, as illustrated in FIG. 2A.

The first metal layer 131 may be provided on the first wiring pattern 121. The first metal layer 131 may cover an entire upper surface of the first wiring pattern 121. A lower surface of the first metal layer 131 may be in direct contact with the upper surface of the first wiring pattern 121, that is, the upper surface of the first pad portion 121b. A width of the first metal layer 131 may be greater than a width of the first pad portion 121b. The first metal layer 131 may vertically overlap the entire first pad portion 121b. Accordingly, the first metal layer 131 may be in contact with the entire upper surface of the first pad portion 121b. When viewed in a plan view, the first pad portion 121b may be located inside the first metal layer 131, as illustrated in FIG. 2B. A thickness of the first metal layer 131 may be smaller than a thickness of the first pad portion 121b. For example, the thickness of the first metal layer 131 may be 300 Å to 1500 Å. In some embodiments, the thickness of the first pad portion 121b may be greater than 1500 Å. A planar shape of the first metal layer 131 and the first wiring pattern 121 may be tetragonal, but example embodiments are not limited thereto, and in some example embodiments the planar shape of the first metal layer 131 may be circular or polygonal.

The first metal layer 131 may have a first portion R1 vertically overlapping the first pad portion 121b and a second portion R2 surrounding the first portion R1. The second portion R2 may be a portion that does not vertically overlap the first pad portion 121b.

The first metal layer 131 may include a first metal and a second metal. The first metal and the second metal may include different materials. A concentration of the first metal in the first metal layer 131 may be greater in the first portion R1 than a concentration of the first metal the second portion R2. For example, the first portion R1 may be a portion where the first metal and the second metal are mixed, and the second portion R2 may be a portion where the second metal is present. In some example embodiments, the first portion R1 may be a portion where the first metal and the second metal are mixed, and the second portion R2 may be a portion where only the second metal is present. A concentration of the first metal in the first metal layer 131 may decrease as a distance from the lower surface of the first metal layer 131 increases. Here, the lower surface of the first metal layer 131 may correspond to an interface between the first metal layer 131 and the first pad portion 121b or a surface of the first pad portion 121b that is in contact with the first metal layer 131. A concentration of the first metal may decrease as a distance to the upper surface of the first metal layer 131 decreases and as a distance to the side surfaces of the first metal layer 131 decreases. For example, in a portion adjacent to the upper surface and a portion adjacent to the side surface of the first metal layer 131, the second metal may be present but the first metal may not be present. For example, the second metal may include nickel (Ni).

The second insulating layer 112 may be provided on the first insulating layer 111. The second insulating layer 112 may cover the first pad portion 121b and the first metal layer 131 on the first insulating layer 111. For example, the second insulating layer 112 may cover a side surface of the first pad portion 121b and cover upper, side, and bottom surfaces of the first metal layer 131. The second insulating layer 112 may have a second opening OP2 that overlaps a portion of the upper surface of the first metal layer 131 to expose the portion of the upper surface of the first metal layer 131.

The second wiring pattern 122 may be provided on the second insulating layer 112. The second wiring pattern 122 may be connected to the first metal layer 131. The second metal layer 132 may be provided on an upper surface of the second wiring pattern 122. The second wiring pattern 122 and the second metal layer 132 may be substantially the same as or similar, respectively, to the first wiring pattern 121 and the first metal layer 131 described above, and thus repeated description thereof is omitted for conciseness. In some example embodiments, a portion of the second wiring pattern 122 may have a different size from a size of the first wiring pattern 121, but a pad portion of the second wiring pattern 122 may have a larger width than a width of a via portion thereof, and the metal layer 132 may have a greater width than the width of the pad portion of the second wiring pattern 122. In some example embodiments, the pad portion of the second wiring pattern 122 may have a larger width than a maximum width of the via portion thereof.

The third insulating layer 113 may be provided on the second insulating layer 112. The third insulating layer 113 may cover the second wiring pattern 122 and the second metal layer 132 on an upper surface of the second insulating layer 112.

The second protective layer 103 may be provided on the third insulating layer 113. The second passivation layer 103 may cover a portion of an upper surface of the second metal layer 132 on the third insulating layer 113. The second protective layer 103 may include, for example, an insulating polymer.

A second redistribution pad 104 may be provided on an upper surface of the redistribution substrate 100. The second redistribution pad 104 may be surrounded by the second protective layer 103. In some example embodiments, the second protective layer 103 may completely cover side surfaces of the second redistribution pad 104 as illustrated in FIG. 1. A lower surface of the second redistribution pad 104 may be exposed on a lower surface of the second protective layer 103. In some example embodiments, the lower surface of the second redistribution pad 104 may be coplanar with the lower surface of the second protective layer 103. The second redistribution pad 104 may be connected to the second metal layer 132. The upper surface of the second redistribution pad 104 may be exposed on an upper surface of the second passivation layer 103. In some example embodiments, the upper surface of the second redistribution pad 104 may be coplanar with the upper surface of the second passivation layer 103. The second redistribution pad 104 may be provided in plural. The second redistribution pads 104 may include a conductive material. The second redistribution pads 104 may include copper, aluminum and/or nickel.

The redistribution substrate 100 according to various embodiments may include the wiring patterns 120 in the insulating layers 110 and the metal layer 130 covering the upper surfaces of the wiring patterns 120. The metal layer 130 may be provided on the upper surface of the wiring pattern 120 and have the wider width than the width of the pad portion of the wiring pattern 120. The metal layer 130 may prevent cracks from being generated at an interface between the side surface of the pad portion and the insulating layers 110 covering the pad portion during heat treatment and increase reliability in a fabricating process of the redistribution substrate 100.

Figure 3:
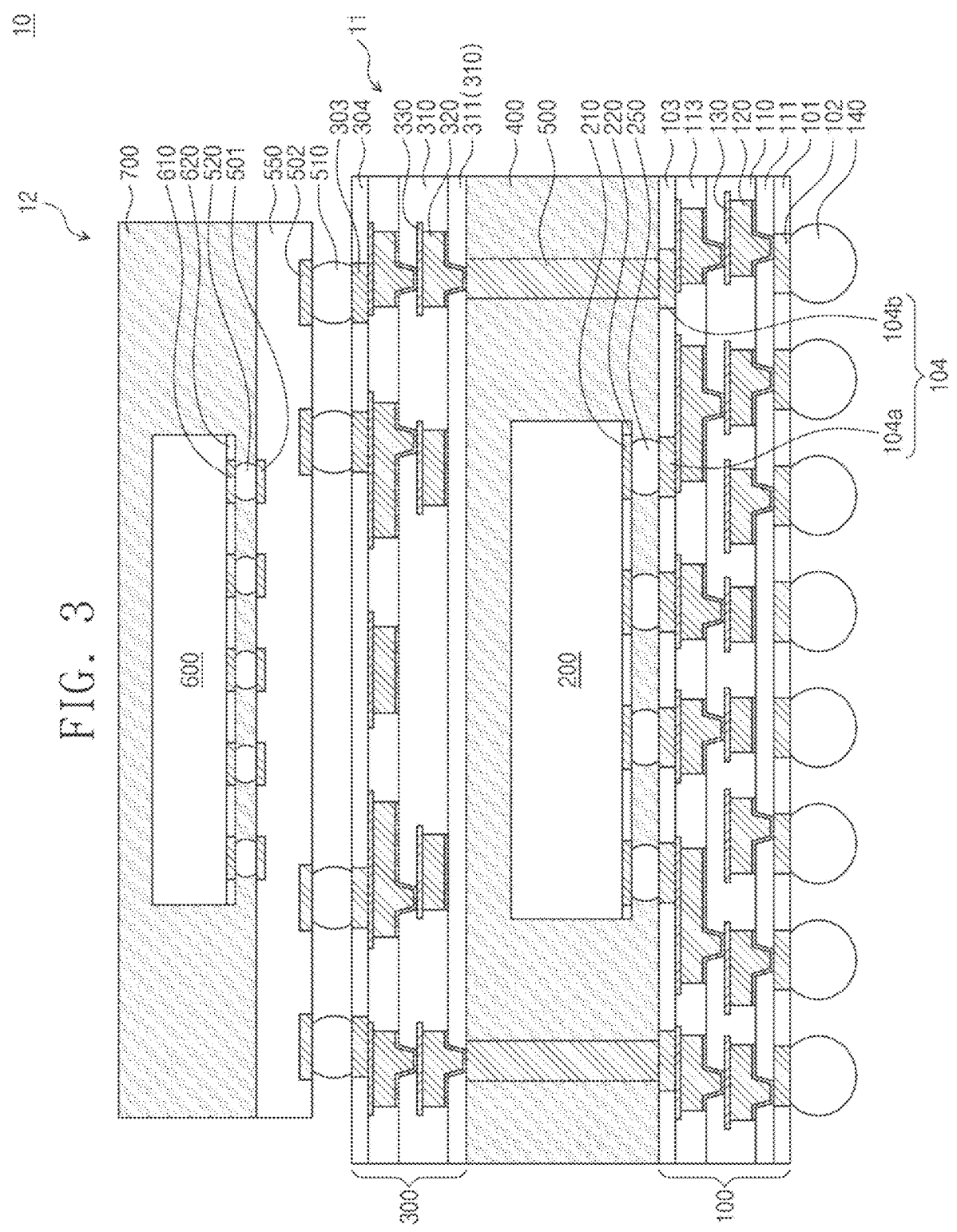
FIGS. 3 and 4 are cross-sectional views of semiconductor packages according to some example embodiments.

FIG. 3 is a cross-sectional view illustrating a semiconductor package according to some example embodiments. The same reference numerals may be provided for the same elements and configurations, and description overlapping with the description of the same elements described above will be omitted for conciseness.

Referring to FIG. 3, a semiconductor package 10 may include a lower package 11 and an upper package 12. The lower package 11 may include the first redistribution substrate 100, external connection terminals 140, a first semiconductor chip 200, a second redistribution substrate 300, a first molding layer 400, and a through electrode 500.

The first redistribution substrate 100 may be substantially the same as or similar to the redistribution substrate 100 described with reference to FIG. 1. The external connection terminals 140 may be provided on a lower surface of the first redistribution substrate 100. The external connection terminals 140 may be provided on the first redistribution pads 102. The external connection terminals 140 may include solder balls or solder bumps. The external connection terminals 140 may include, for example, tin, bismuth, lead, silver, or an alloy thereof.

The first semiconductor chip 200 may be provided on the first redistribution substrate 100. The first semiconductor chip 200 may be, for example, a logic chip or a buffer chip. The logic chip may include an ASIC chip or an application processor (AP) chip. In some example embodiments, the logic chip may include a central processing unit (CPU) or a graphics processing unit (GPU). The ASIC chip may include an application specific integrated circuit (ASIC). In some example embodiments, the first semiconductor chip 200 may be a memory chip.

The first semiconductor chip 200 may include first chip pads 210 provided on a lower surface of the first semiconductor chip 200. The first chip pads 210 may be electrically connected to an integrated circuit formed in the first semiconductor chip 200. The first chip pads 210 may be exposed on the lower surface of the first semiconductor chip 200. The first chip pads 210 may include a conductive material. For example, the first chip pads 210 may include copper, aluminum, and/or nickel.

A first chip passivation layer 220 may be provided on the lower surface of the first semiconductor chip 200. The first chip passivation layer 220 may surround the first chip pads 210. The first chip passivation layer 220 may expose lower surfaces of the first chip pads 210. The lower surface of the first chip passivation layer 220 and the lower surfaces of the first chip pads 210 may be coplanar with each other. The first chip passivation layer 220 may include an insulating material such as silicon oxide, silicon nitride, or silicon carbonitride.

The first semiconductor chip 200 may be flip-chip bonded on the first redistribution substrate 100. The second redistribution pads 104 may include inner second redistribution pads 104a and outer second redistribution pads 104b. In detail, first chip connection terminals 250 may be provided between the inner second redistribution pads 104a and the first chip pads 210. The first chip connection terminals 250 may be connected to the inner second redistribution pads 104a and the first chip pads 210. Accordingly, the first semiconductor chip 200 may be electrically connected to the first redistribution substrate 100. The first chip connection terminals 250 may include solder balls or solder bumps. The first chip connection terminals 250 may include, for example, tin, bismuth, lead, silver, or an alloy thereof.

The through electrode 500 may be provided on the first redistribution substrate 100. The through electrode 500 may be provided on the outer second redistribution pad 104*b*. The through electrode 500 may be electrically connected to the first redistribution substrate 100 through the outer second redistribution pad 104*b*. The through electrode 500 may be provided in plural. The through electrodes 500 may be horizontally spaced apart from the first semiconductor chip 200. The through electrodes 500 may surround the first semiconductor chip 200. When viewed in a plan view, the through electrodes 500 may be disposed between a side surface of the first redistribution substrate 100 and a side surface of the first semiconductor chip 200. The through electrodes 500 may include a conductive material. The through electrodes 500 may include, for example, copper or tungsten.

The first molding layer 400 may be provided on the first redistribution substrate 100. The first molding layer 400 may cover the first semiconductor chip 200 and the through electrodes 500 on an upper surface of the first redistribution substrate 100. The first molding layer 400 may surround the first chip connection terminals 250 between the first redistribution substrate 100 and the first semiconductor chip 200. The through electrodes 500 may vertically penetrate the first molding layer 400 and be connected to the second redistribution pads 104. An upper surface of the first molding layer 400 may be coplanar with upper surfaces of the through electrodes 500. The first molding layer 400 may include an insulating polymer such as an epoxy-based molding compound (EMC).

The second redistribution substrate 300 may be provided on the first molding layer 400. An insulating layer 310, a wiring pattern 320, a metal layer 330, a third protective layer 304, and a third redistribution pad 303 of the second redistribution substrate 300 may be substantially the same as or similar to the insulating layer 110, the wiring pattern 120, the metal layer 130, the second protective layer 103, and the second redistribution pad 104 of the first redistribution substrate 100, respectively, and thus a detailed description thereof is omitted for conciseness. For example, the metal layer 330 may be provided on a pad portion of the wiring pattern 320 within the insulating layer 310, and the metal layer 330 may have a wider width than a width of the pad portion. The metal layer 330 may vertically overlap the entire wiring pattern 320. The wiring pattern 320 may include a first metal. The metal layer 330 may include the first metal and a second metal different from the first metal. The metal layer 330 may include a first portion that vertically overlaps the pad portion and a second portion that does not vertically overlap the pad portion. The first portion may have a higher concentration of the first metal than a concentration of the first metal in the second portion. A concentration of the first metal in the metal layer 330 may decrease as a distance from a lower surface of the metal layer 330 increases. The lower surface of the metal layer 330 may be an interface between the metal layer 330 and the wiring pattern 320 or the lower surface of the metal layer 330 may be a surface where the metal layer 330 and the wiring pattern 320 are in contact. A concentration of the first metal may decrease as a distance from an upper surface of the metal layer 330 decreases, or as a distance from side surfaces of the metal layer 330 decreases. For example, the first metal may include copper (Cu), and the second metal may include nickel (Ni).

A lowermost wiring pattern 320 may be exposed on a lower surface of the second redistribution substrate 300. For example, a via portion of the lowermost wiring pattern 320 may pass through a lowermost insulating layer 310 and be connected to the through electrode 500. Accordingly, the first redistribution substrate 100 and the second redistribution substrate 300 may be electrically connected by the through electrode 500.

The upper package 12 may be provided on the second redistribution substrate 300. The upper package 12 may include an upper substrate 550, second chip connection terminals 520, a second semiconductor chip 600, and a second molding layer 700.

The upper substrate 550 may be provided on the second redistribution substrate 300. The upper substrate 550 may be a printed circuit board. In some example embodiments, the upper substrate 550 may be a redistribution substrate. The upper substrate 550 may include a first substrate pad 501 on an upper surface of the upper substrate 550 and a second substrate pad 502 on a lower surface of the upper substrate 550. The first substrate pad 501 may be exposed onto the upper surface of the upper substrate 550. The second substrate pad 502 may be exposed onto the lower surface of the upper substrate 550. Although not shown, the upper substrate 550 may include wirings electrically connecting the first substrate pad 501 and the second substrate pad 502.

Substrate connection terminals 510 may be provided between the upper substrate 550 and the second redistribution substrate 300. The substrate connection terminals 510 may be connected to the second substrate pad 502 and the third redistribution pad 303. The substrate connection terminals 510 may electrically connect the upper package 12 and the lower package 11.

The second semiconductor chip 600 may be provided on the upper substrate 550. The second semiconductor chip 600 may have second chip pads 610 provided on a lower surface of the second semiconductor chip 600. The second chip pads 610 may be electrically connected to an integrated circuit formed in the second semiconductor chip 600. The second chip pads 610 may include a conductive material. For example, the second chip pads 610 may include copper, aluminum, and/or nickel.

A second chip passivation layer 620 may be provided on the lower surface of the second semiconductor chip 600. The second chip passivation layer 620 may surround the second chip pads 610. The second chip passivation layer 620 may expose lower surfaces of the second chip pads 610. A lower surface of the second chip passivation layer 620 and the lower surface of the second chip pads 610 may be coplanar with each other. The second chip passivation layer 620 may include an insulating material such as silicon oxide, silicon nitride, or silicon carbonitride.

The second semiconductor chip 600 may be mounted on the upper substrate 550. For example, the second semiconductor chip 600 may be flip-chip bonded on the upper substrate 550. The second chip connection terminals 520 may be provided between the second semiconductor chip 600 and the upper substrate 550. The second chip connection terminals 520 may be disposed between the second chip pads 610 and the first substrate pad 501. The second chip connection terminals 520 may be connected to the second chip pads 610 and the first substrate pad 501. Accordingly, the second semiconductor chip 600 may be electrically connected to the lower package 11 through the upper substrate 550. The second chip connection terminals 520 may include solder balls or solder bumps. The second chip connection terminals 520 may include, for example, tin, bismuth, lead, silver, or an alloy thereof. In some example embodiments, the second semiconductor chip 600 may be wire-bonded on the upper substrate 550.

The second molding layer 700 may be provided on the upper substrate 550. The second molding layer 700 may cover the second semiconductor chip 600 on an upper surface of the upper substrate 550. The second molding layer 700 may surround the second chip connection terminals 520 between the upper substrate 550 and the second semiconductor chip 600. In some example embodiments, an underfill may be provided between the upper substrate 550 and the second semiconductor chip 600. The second molding layer 700 may include an insulating polymer such as an epoxy-based molding compound (EMC).

Figure 4:
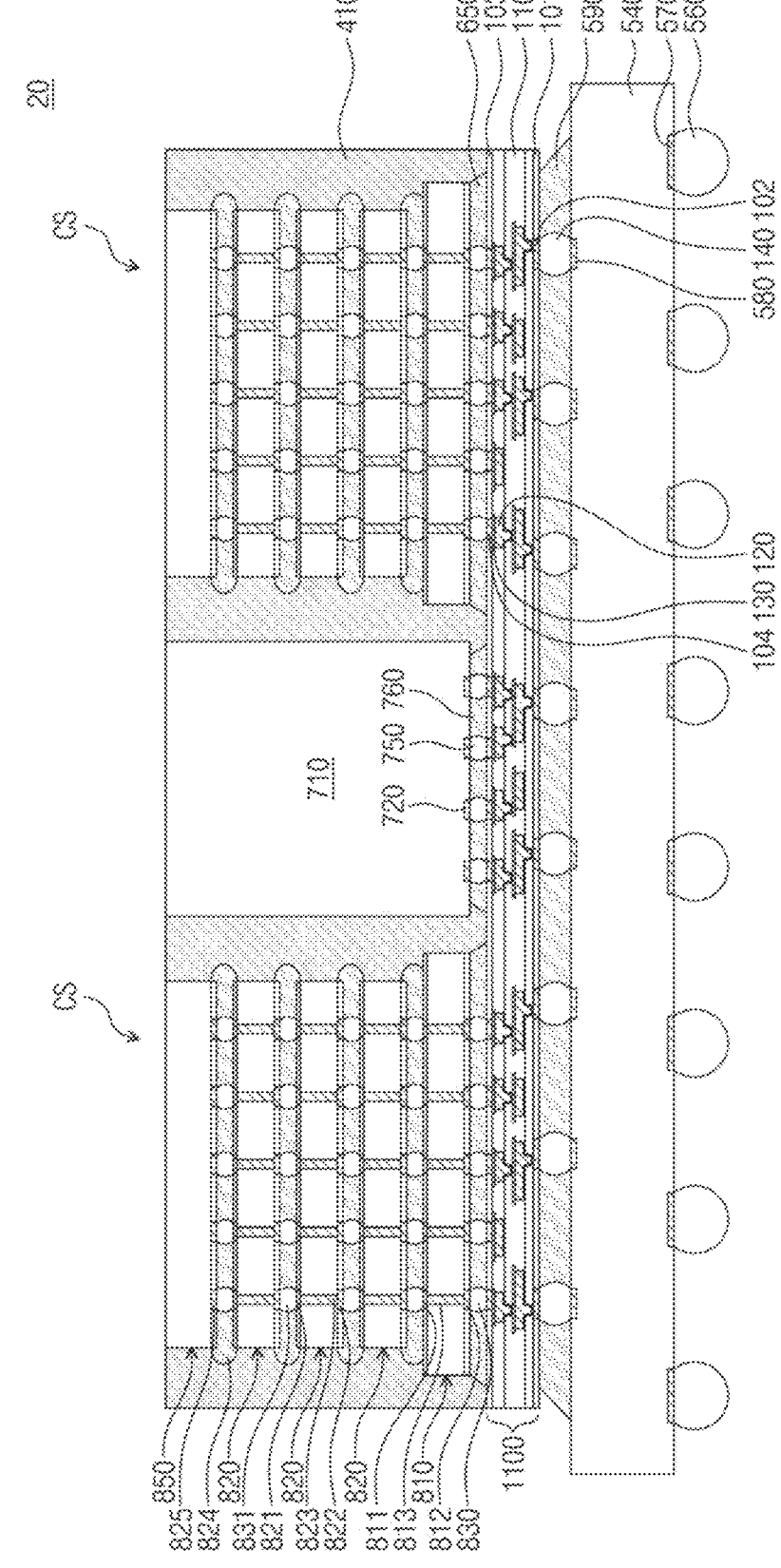

FIG. 4 is a cross-sectional view of a semiconductor package according to some example embodiments. The same reference numerals may be provided for the same elements and configurations, and description overlapping with the description of the same elements described above will be omitted for conciseness.

Referring to FIG. 4, a semiconductor package 30 may include a package substrate 540, a package connection terminal 560, a redistribution substrate 1100, chip stacks CS, a semiconductor device 710, and a molding layer 410.

The package substrate 540 may be a printed circuit board including wiring patterns printed on upper and lower surfaces. In some example embodiments, the package substrate 540 may be the same as or similar to the redistribution substrate 100 described with reference to FIG. 1, and thus a repeated detailed description thereof is omitted for conciseness. First upper substrate pads 580 may be disposed on the upper surface of the package substrate 540. The first upper substrate pads 580 may be exposed onto the upper surface of the package substrate 540. First lower substrate pads 570 may be disposed on the lower surface of the package substrate 540. The first lower substrate pads 570 may be exposed onto the lower surface of the package substrate 540. Although not shown, the first upper substrate pads 580 and the first lower substrate pads 570 may be electrically connected through wirings in the package substrate 540. The first upper substrate pads 580 and the first lower substrate pads 570 may include a conductive material. For example, the first upper substrate pads 580 and the first lower substrate pads 570 may include copper, aluminum, and/or nickel.

The package connection terminals 560 may be disposed on the lower surface of the package substrate 540. The package connection terminals 560 may be disposed on the first lower substrate pads 570. The package connection terminals 560 may include solder balls or solder bumps. The package connection terminals 560 may be one of tin, silver, copper, nickel, bismuth, indium, antimony, or cerium, or an alloy thereof.

The redistribution substrate 1100 may be provided on the package substrate 540. The redistribution substrate 1100 may be substantially the same as or similar to the redistribution substrate 100 described with reference to FIG. 1, and thus a repeated detailed description thereof is omitted for conciseness. External connection terminals 140 may be provided between the redistribution pad 102 and the first upper substrate pads 580 to electrically connect the package substrate 540 and the redistribution substrate 1100.

A first underfill 590 may be provided between the package substrate 540 and the redistribution substrate 1100. The first underfill 590 may surround the external connection terminals 140 and fill between the external connection terminals 140.

The chip stacks CS may be provided on the redistribution substrate 1100. Each of the chip stacks CS may include a base semiconductor chip 810, lower semiconductor chips 820, and upper semiconductor chips 850. The lower semiconductor chips 820 and the upper semiconductor chip 850 may be sequentially stacked on the base semiconductor chip 810. A width of the base semiconductor chip 810 may be greater than a width of the upper semiconductor chip 850 and a width of each of the lower semiconductor chips 820. A width of the upper semiconductor chip 850 and a width of each of the lower semiconductor chips 820 may be substantially the same. The same thickness, size, level, and width of certain components may mean equality within an error range that is capable of occurring in a process. The base semiconductor chip 810 may include a logic chip, a controller chip, or a buffer chip. The upper semiconductor chip 850 and the lower semiconductor chips 820 may include different types of semiconductor chips from the base semiconductor chip 810. The upper semiconductor chip 850 and the lower semiconductor chips 820 may include memory chips.

The base semiconductor chip 810 may include first upper chip pads 811, first lower chip pads 812, and first through electrodes 813.

The first lower chip pads 812 may be provided on a lower surface of the base semiconductor chip 810. The first lower chip pads 812 may be electrically connected to a circuit layer of the base semiconductor chip 810. The first upper chip pads 811 may be provided on an upper surface of the base semiconductor chip 810. The first upper chip pads 811 may be surrounded by a protective layer on the upper surface of the base semiconductor chip 810. The first upper chip pads 811 and the first lower chip pads 812 may include a conductive material such as copper, aluminum, and/or nickel.

The first through electrodes 813 may be provided in the base semiconductor chip 810. The first through electrodes 813 may vertically penetrate the base semiconductor chip 810. The first through electrodes 813 may be connected to corresponding first upper chip pads 811 and first lower chip pads 812, respectively. The first through electrodes 813 may include copper, titanium, tungsten, and/or combinations thereof.

The lower semiconductor chips 820 may be vertically stacked on the base semiconductor chip 810. Hereinafter, configurations of the lower semiconductor chips 820 will be described based on one lower semiconductor chip 820.

The lower semiconductor chip 820 may include second upper chip pads 821, second lower chip pads 822, and second through electrodes 823.

The second lower chip pads 822 may be provided on a lower surface of the lower semiconductor chip 820. The second lower chip pads 822 may be electrically connected to a circuit layer of the lower semiconductor chip 820. The second upper chip pads 821 may be provided on an upper surface of the lower semiconductor chip 820. The second upper chip pads 821 may be surrounded by a protective layer on the upper surface of the lower semiconductor chip 820. The second upper chip pads 821 and the second lower chip pads 822 may include a conductive material such as copper, aluminum, and/or nickel.

The second through electrodes 823 may be provided in the lower semiconductor chip 820. The second through electrodes 823 may vertically penetrate the lower semiconductor chip 820. The second through electrodes 823 may be connected to corresponding second upper chip pads 821 and second lower chip pads 822, respectively. The second through electrodes 823 may include copper, titanium, tungsten, and/or combinations thereof.

The upper semiconductor chip 850 may be disposed on the lower semiconductor chips 820. Third lower chip pads 825 may be provided on a lower surface of the upper semiconductor chip 850. The third lower chip pads 825 may be electrically connected to a circuit layer of the upper semiconductor chip 850.

Connection bumps 831 may be provided between two adjacent semiconductor chips of the base semiconductor chip 810, the lower semiconductor chips 820, and the upper semiconductor chip 850. The connection bumps 831 may be disposed between corresponding first upper chip pads 811, second upper chip pads 821, second lower chip pads 822, and third lower chip pads 825, respectively. The connection bumps 831 may electrically connect the base semiconductor chip 810, the lower semiconductor chips 820, and the upper semiconductor chip 850.

The non-conductive layers 824 may fill between adjacent two semiconductor chips of the base semiconductor chip 810, the lower semiconductor chips 820, and the upper semiconductor chip 850. The non-conductive layers 824 may surround the connection bumps 831 between the base semiconductor chip 810, the lower semiconductor chips 820, and the upper semiconductor chip 850. The non-conductive layers 824 may protrude from the side surfaces of the upper semiconductor chip 850 and the lower semiconductor chips 820. The non-conductive layers 824 may include non-conductive film (NCF) or non-conductive paste (NCP). In some example embodiments, the non-conductive layers 824 may include an insulating polymer.

The chip stacks CS may be horizontally spaced apart from each other. The chip stacks CS may be mounted on the redistribution substrate 1100. Stack connection terminals 830 may be provided between the chip stacks CS and the redistribution substrate 1100. The stack connection terminals 830 may be disposed to correspond to each of the second redistribution pad 104 of the redistribution substrate 1100 and the first lower chip pads 812 of the base semiconductor chip 810. The chip stacks CS may be electrically connected to the package substrate 540 through the redistribution substrate 1100. The stack connection terminals 830 may include solder balls or solder bumps. The stack connection terminals 830 may include tin, silver, copper, nickel, bismuth, indium, antimony, cerium, and/or combinations thereof.

A second underfill 650 may be provided between the base semiconductor chip 810 and the redistribution substrate 1100. The second underfill 650 may surround the stack connection terminals 830 between the base semiconductor chip 810 and the redistribution substrate 1100 and may fill between the stack connection terminals 830.

The semiconductor device 710 may be provided between the chip stacks CS on the redistribution substrate 1100. The semiconductor device 710 may be a semiconductor chip. The semiconductor device 710 may include third chip pads 720 provided on its lower surface. The third chip pads 720 may be electrically connected to a circuit layer of the semiconductor device 710. Third chip connection terminals 750 may be provided between the third chip pads 720 and the second redistribution pad 104 of the redistribution substrate 1100. The semiconductor device 710 may be mounted on the redistribution substrate 1100 through the third chip connection terminals 750.

The molding layer 410 may be provided on the redistribution substrate 1100. The molding layer 410 may surround the semiconductor device 710 and the chip stacks CS on an upper surface of the redistribution substrate 1100. The molding layer 410 may expose upper surfaces of the semiconductor device 710 and the chip stacks CS. In some example embodiments, the molding layer 410 may bury the semiconductor device 710 and the chip stacks CS. The molding layer 410 may include an insulating polymer such as an epoxy-based molding compound.

FIGS. 5 to 12 are cross-sectional views illustrating a method of fabricating a redistribution substrate according to some example embodiments.

Figure 5:
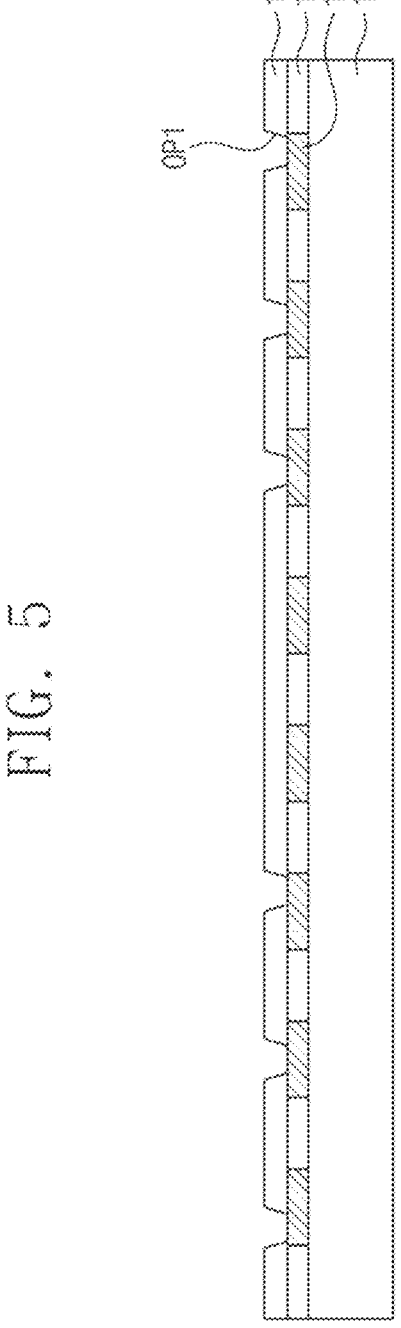
FIGS. 5 to 12 are cross-sectional views illustrating a method of fabricating a redistribution substrate according to some example embodiments.

Referring to FIG. 5, a first protective layer 101 may be formed on a carrier substrate 1000. Although not shown, an adhesive layer for adhering the first protective layer 101 to the carrier substrate 1000 may be formed. A first redistribution pad 102 may be formed in the first passivation layer 101. The first redistribution pad 102 may be exposed through upper and lower surfaces of the first protective layer 101.

A first insulating layer 111 may be formed on the upper surface of the first protective layer 101. The first insulating layer 111 may be formed by coating an insulating material on the first protective layer 101. The insulating material may include a photo-imageable dielectric (PID) material. The photo-imageable dielectric material may be a polymer. The photo-imageable dielectric material may include, for example, at least one of photosensitive polyimide, polybenzoxazole, phenol-based polymer, and benzocyclobutene-based polymer.

The first insulating layer 111 may be patterned to form a first opening OP1. The first opening OP1 may be formed by performing exposure and development processes on the first insulating layer 111. For example, the first opening OP1 may be formed by forming a mask on the first insulating layer 111 and then etching using the mask. The formation of the first insulating layer 111 may further include a curing process of the insulating material.

The first opening OP1 may connect upper and lower surfaces of the first insulating layer 111. The first opening OP1 may have a narrower width toward the lower surface of the first insulating layer 111. The first opening OP1 may expose at least a portion of the upper surface of the first redistribution pad 102.

Figure 6:
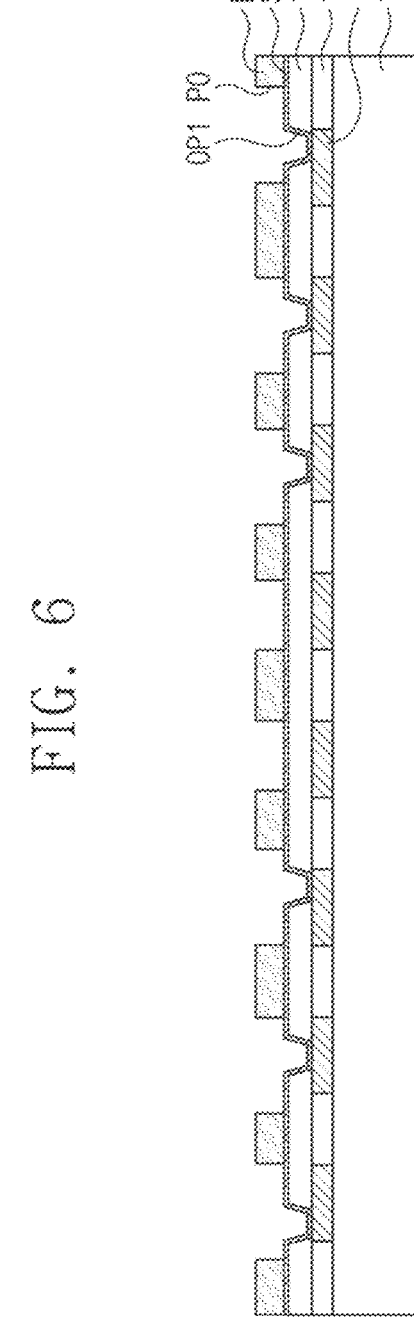

Referring to FIG. 6, a seed layer SL may be formed on the first insulating layer 111. The seed layer SL may be formed by plating or depositing a conductive material on the first insulating layer 111. The seed layer SL may conformally cover an upper surface of the first insulating layer 111, an upper surface of the first redistribution pad 102, and an inner wall of the first opening OP1. The seed layer SL may include a conductive material such as titanium.

A photoresist pattern PR may be formed on the seed layer SL. A third opening PO exposing at least a portion of an upper surface of the seed layer SL may be formed by patterning the photoresist pattern PR. The third opening PO may be formed on the first opening OP1. The third opening PO may be formed to have a larger width than a width of the first opening OP1. At least a portion of the third opening PO may vertically overlap the first opening OP1. For example, when viewed in a plan view, the first opening OP1 may be located inside the third opening PO. The third opening PO may be connected to the first opening OP1.

Figure 7:
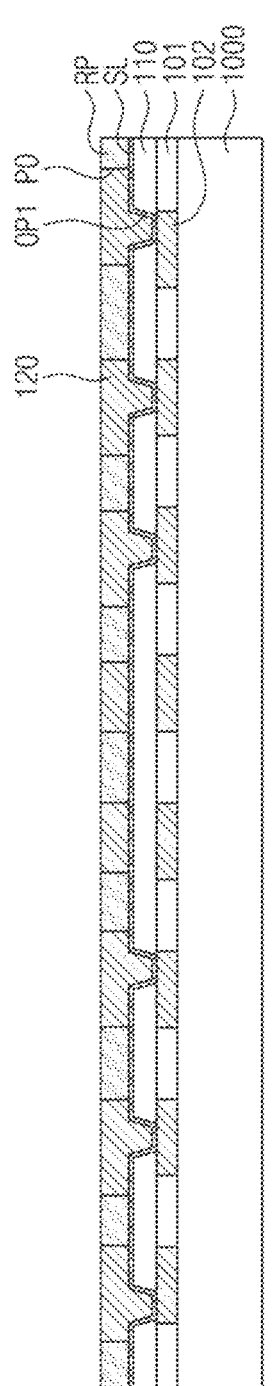

Referring to FIG. 7, a wiring pattern 120 may be formed in the third opening PO and the first opening OP1. The wiring pattern 120 may be formed through plating using the seed layer SL as an electrode. The wiring pattern 120 may cover the seed layer SL. The wiring pattern 120 formed in the first opening OP1 may correspond to the via portion 121*a* (in FIG. 2). The wiring pattern 120 formed in the third opening PO may correspond to the pad portion 121*b* (in FIG. 2). The wiring pattern 120 may include a first metal. For example, the first metal may include copper.

Figure 8:
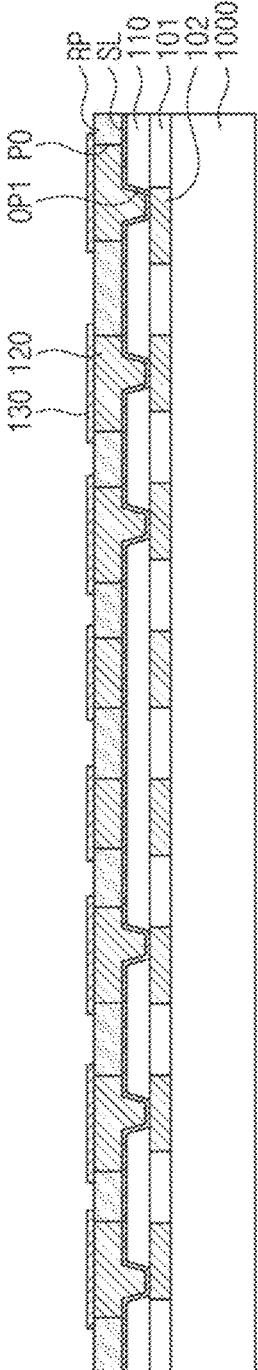

Referring to FIG. 8, a metal layer 130 may be formed on the wiring pattern 120. The metal layer 130 may be formed on the wiring pattern 120 by plating a conductive material. The conductive material may be plated on an upper surface of the wiring pattern 120 and may extend onto an upper surface of the photoresist pattern PR. The metal layer 130 may be formed to have a width greater than a width of the wiring pattern 120. The metal layer 130 may be formed to have a thickness of 300 Å to 1500 Å. The metal layer 130 may include a second metal different from the first metal. For example, the second metal may include nickel.

Figure 9:
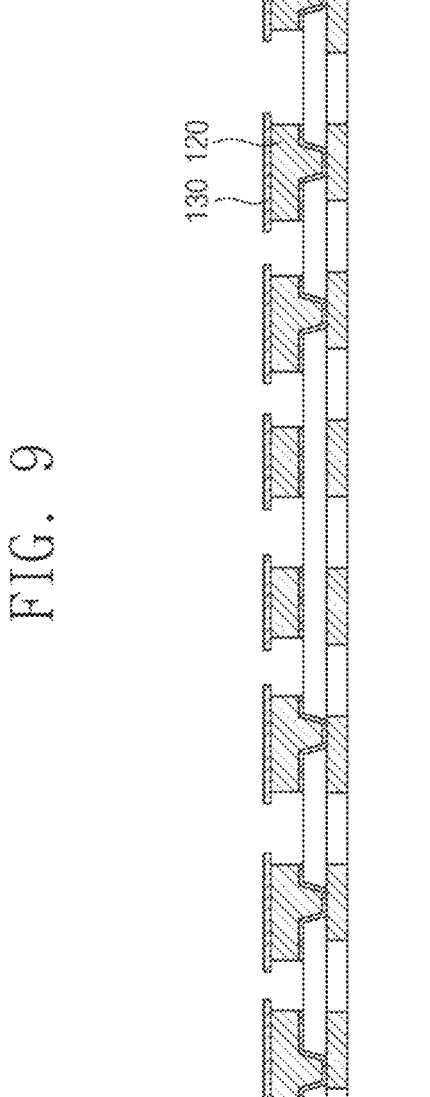

Referring to FIG. 9, the photoresist pattern PR and a portion of the seed layer SL described above may be removed by an etching process. The other portion of the seed layer SL not removed by the etching process may form a seed pattern SP between the first insulating layer 111 and the wiring pattern 120.

Figure 10:
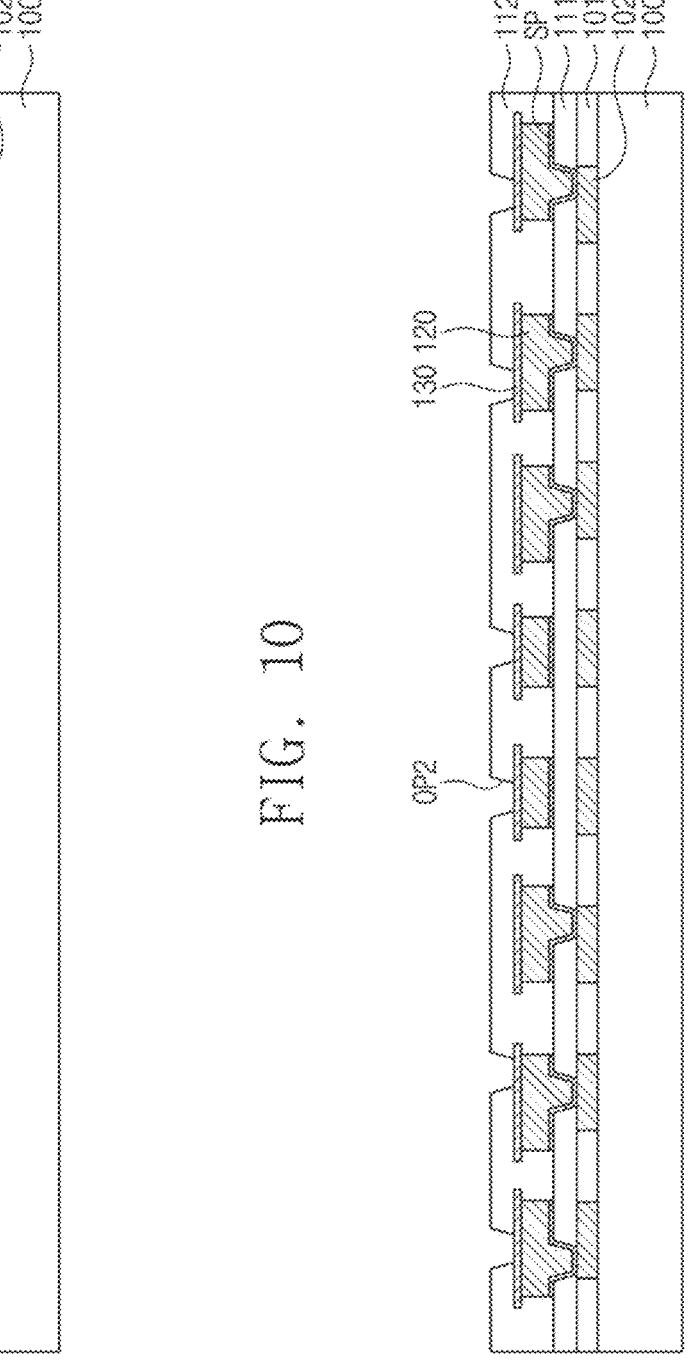

Referring to FIG. 10, a second insulating layer 112 may be formed on the first insulating layer 111. The second insulating layer 112 may be formed by applying an insulating material to cover the wiring pattern 120 and the metal layer 130 on the first insulating layer 111.

The second insulating layer 112 may be patterned to form a second opening OP2. A method of forming the second opening OP2 may be the same as the method of forming the first opening OP1 of FIG. 5, and thus a repeated description thereof is omitted for conciseness. The formation of the second insulating layer 112 may further include a curing process of curing the insulating material.

The second opening OP2 may become narrower as a distance from a lower surface of the second insulating layer 112 decreases. The second opening OP2 may expose at least a portion of an upper surface of the metal layer 130.

Figure 11:
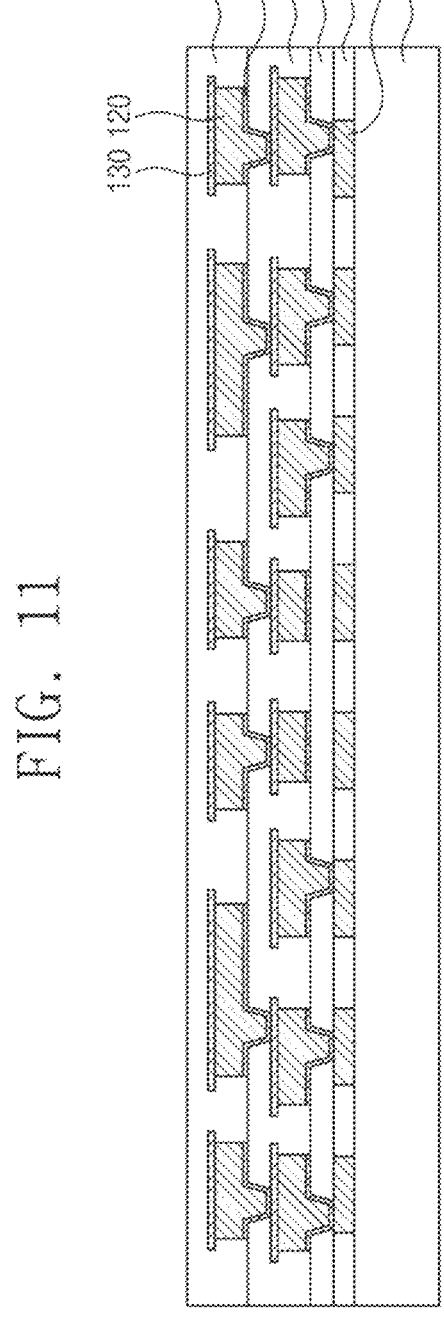

Referring to FIG. 11, the processes described with reference to FIGS. 6 to 10 may be repeated on the second insulating layer 112. Accordingly, a wiring pattern 120, a metal layer 130, and a third insulating layer 113 may be formed on the second insulating layer 112.

Figure 12:
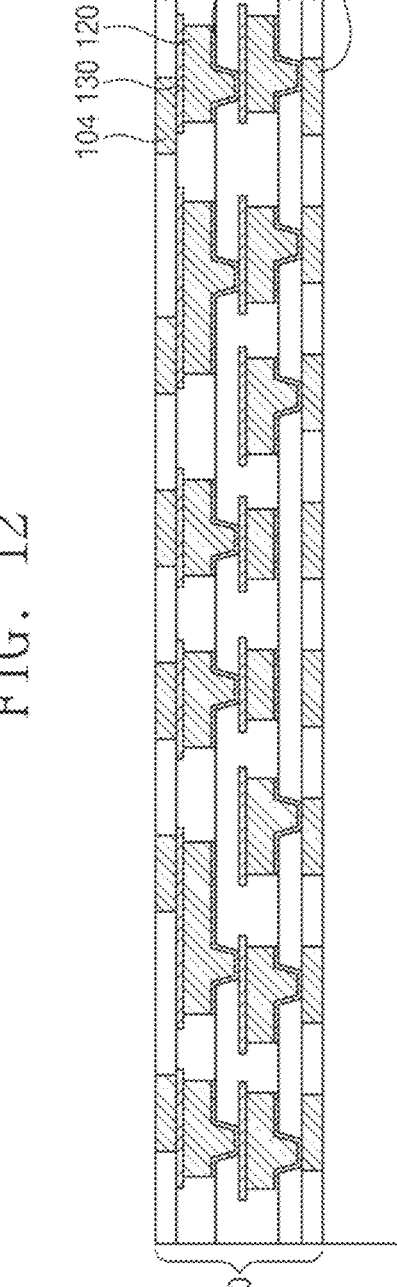

Referring to FIG. 12, a second protective layer 103 may be formed on the third insulating layer 113. A second redistribution pad 104 may be formed in the second passivation layer 103. The second redistribution pad 104 may be exposed onto an upper surface of the second passivation layer 103. The second redistribution pad 104 may be connected to the metal layer 130.

Referring back to FIGS. 1 and 5, the carrier substrate 1000 may be removed thereby forming the redistribution substrate 100 illustrated in FIG. 1. As illustrated in FIGS. 5 to 12, although the method of fabricating the redistribution substrate in which three insulating layers are stacked is shown, example embodiments are not limited thereto. In some example embodiments, the redistribution substrate in which four or more insulating layers are stacked may be fabricated by repeatedly performing the processes of FIGS. 5 to 11.

In a process of fabricating the redistribution substrate in which the metal layer is not provided, the first metal constituting the wiring pattern may diffuse into the insulating layer on the wiring pattern, and at this time, by-products may be formed by a reaction between the material constituting the insulating layer and the first metal. The by-products remain in the openings of the insulating layer, and thus, voids may be formed in the redistribution substrate. Accordingly, structural stability of the redistribution substrate may be lowered.

By contrast, according to various example embodiments, the method of fabricating the redistribution substrate 100 may include forming a metal layer 130 covering the wiring pattern 120 in the insulating layer 110. The metal layer 130 may include a second metal having a relatively lower diffusivity than a diffusivity of the first metal of the wiring pattern and a lower reactivity with the insulating layer 110. Accordingly, by-products may not be formed between the metal layer 130 and the insulating layer 110.

In addition, the metal layer 130 may function as a barrier layer preventing diffusion of the first metal of the wiring pattern 120 into the insulating layer 110. When forming the insulating layer 110, the first metal of the wiring pattern 120 may diffuse into the metal layer 130 due to heat accompanying the curing process, but the metal layer 130 may prevent diffusion of the first metal to the insulating layer 110. For example, when a thickness of the metal layer is less than 300 Å, the first metal of the wiring pattern may pass through the metal layer and diffuse to the insulating layer, and thus the by-product described above may be formed. According to some example embodiments, the metal layer 130 may be formed to a thickness of 300 Å to 1500 Å such that the first metal may be diffused only in a portion adjacent to a lower surface of the metal layer 130 and may not be diffused to a portion adjacent to an upper and side surfaces of the metal layer 130. Accordingly, the metal layer 130 may prevent formation of by-products due to diffusion of the first metal, and structural stability of the redistribution substrate 100 may be improved by the metal layer 130.

FIGS. 13 to 16 are cross-sectional views illustrating a method of fabricating a semiconductor package according to some example embodiments.

Figure 13:
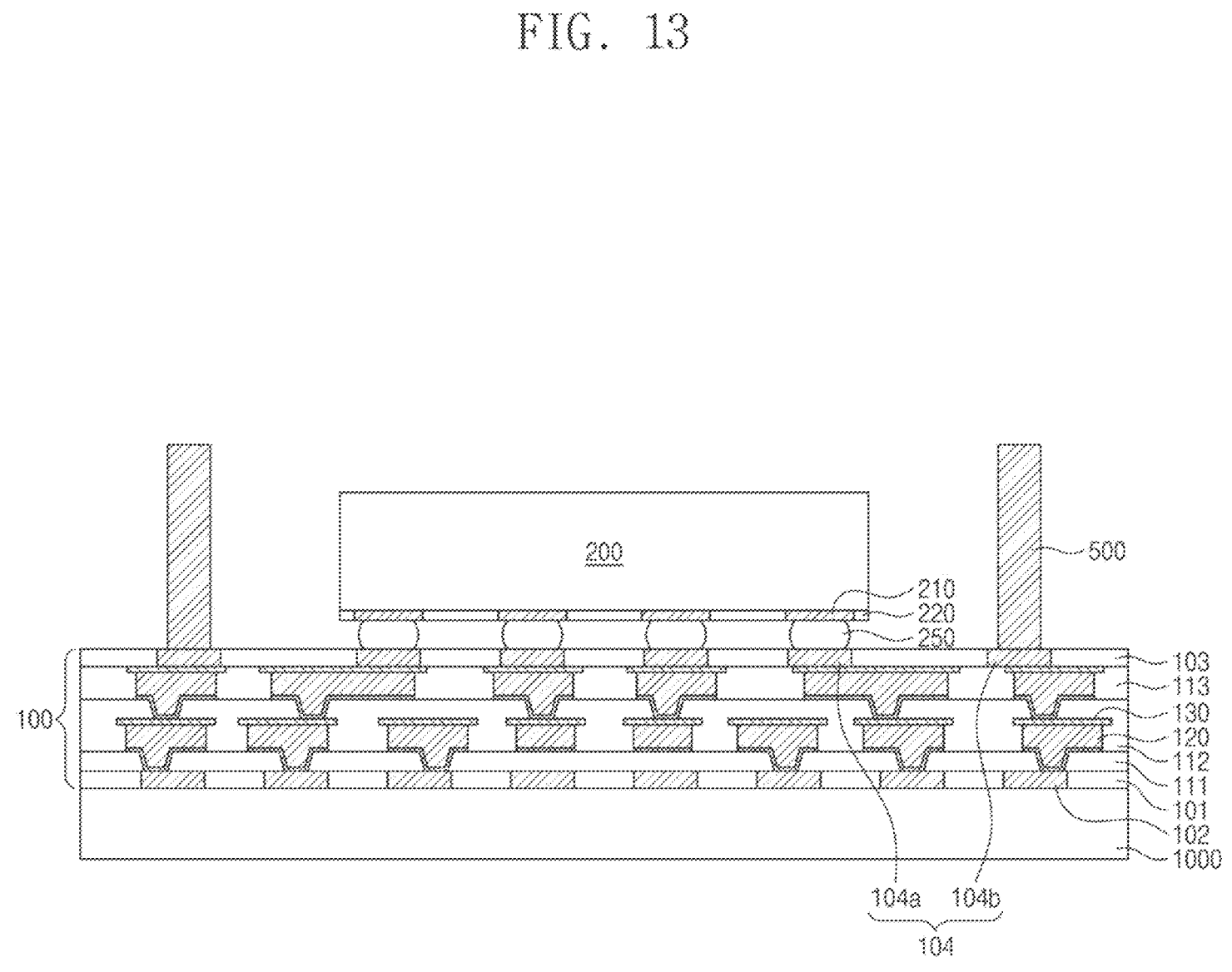

Referring to FIG. 13, the redistribution substrate 100 fabricated by the processes described above with respect to FIGS. 5 to 12 may be used to form a first redistribution substrate 100 in a semiconductor package fabricating process. Through electrodes 500 may be formed on the first redistribution substrate 100. The through electrodes 500 may be formed on the outer second redistribution pad 104*b*. Although not shown, after forming a sacrificial layer on the first redistribution substrate 100, a through hole may be formed in the sacrificial layer to expose the outer second redistribution pad 104*b*. The through electrodes 500 may be formed by performing an electroplating process to fill the through hole. The through electrodes 500 may extend from an upper surface of the second redistribution pad 104*b* in a direction perpendicular to the first redistribution substrate 100.

A first semiconductor chip 200 may be provided between the through electrodes 500 on the first redistribution substrate 100. The first semiconductor chip 200 may be flip-chip bonded on the first redistribution substrate 100. For example, after providing a first chip connection terminal 250 on a first chip pad 210 of the first semiconductor chip 200, the first semiconductor chip 200 may be disposed on the first redistribution substrate 100 to arrange the inner second redistribution pads 104*a* and the first chip connection terminal 250. Thereafter, the first semiconductor chip 200 may be mounted on the first redistribution substrate 100 by performing a reflow process on the first chip connection terminal 250.

Figure 14:
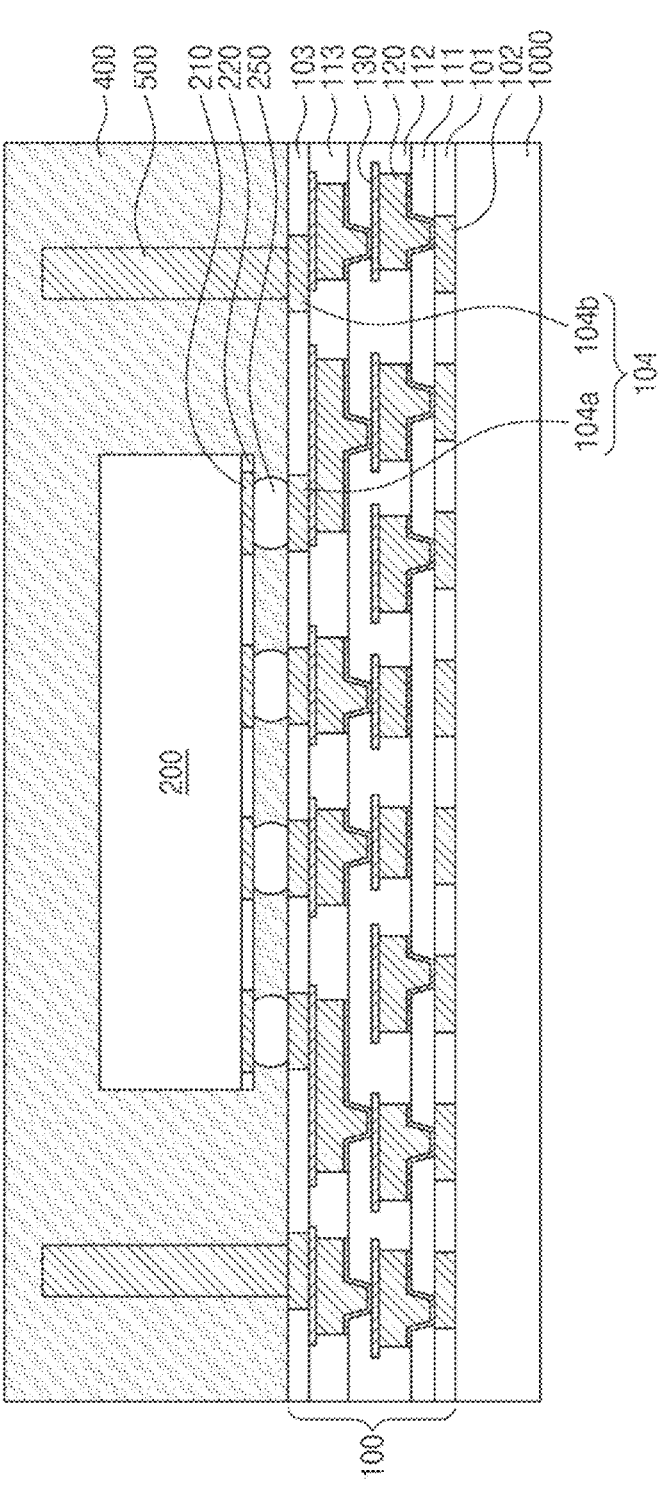

Referring to FIG. 14, a first molding layer 400 may be formed on the first redistribution substrate 100. The first molding layer 400 may cover the first semiconductor chip 200 and the through electrodes 500.

Figure 15:
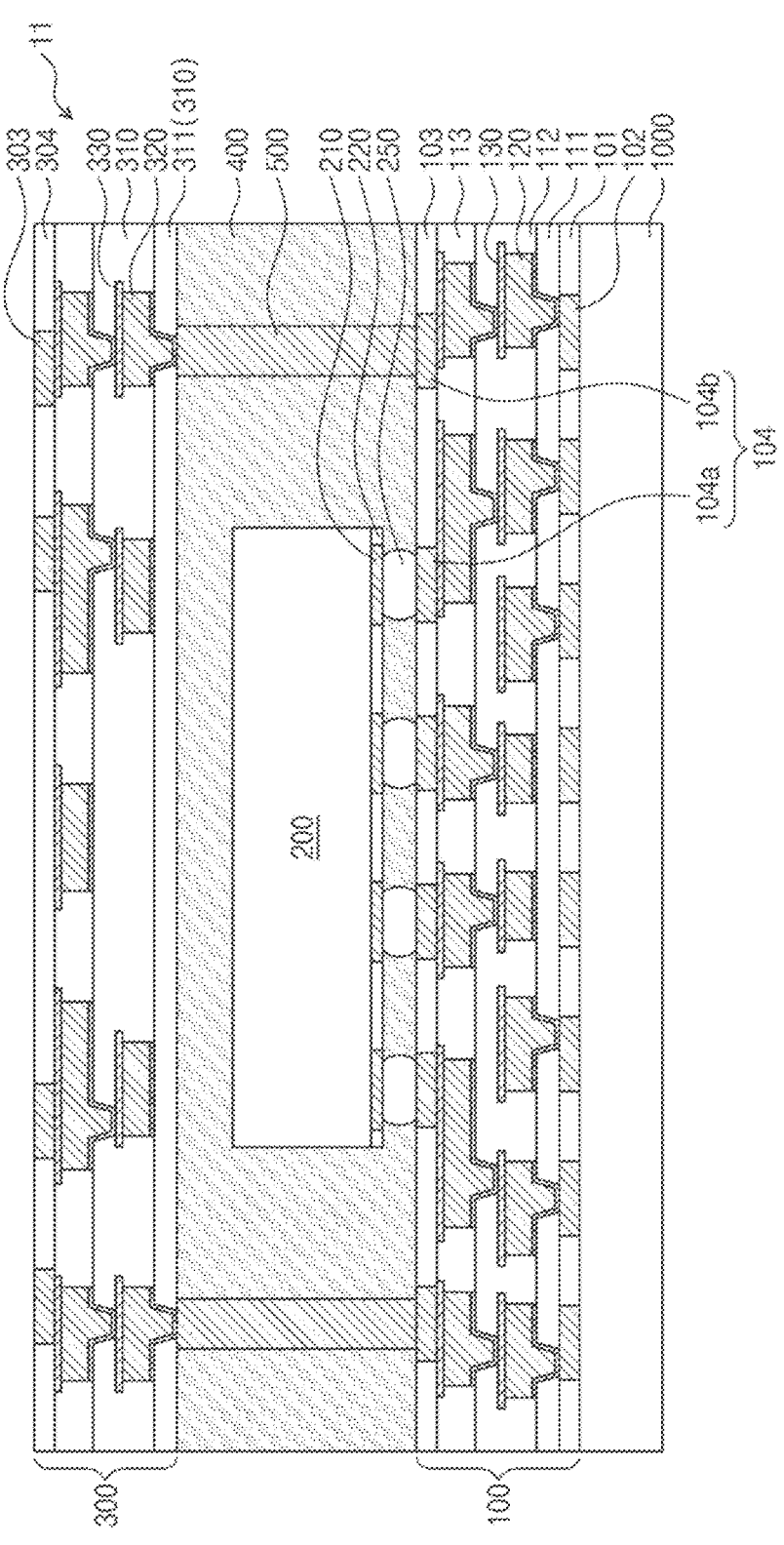

Referring to FIG. 15, an upper portion of the molding layer 400 may be removed through a grinding process. In some example embodiments, upper portions of the through electrodes 500 and the molding layer 400 may be removed together. Through the grinding process, an upper surface of the molding layer 400 and a upper surface of the through electrodes 500 may be coplanar with each other. Unlike what is shown, the upper surface of the first semiconductor chip 200 may be exposed through the grinding process. The grinding process may be performed by, for example, a chemical mechanical polishing process (CMP).

A second redistribution substrate 300 may be formed on the upper surface of the molding layer 400. A fourth insulating layer 311 may be formed on the molding layer 400. An opening of the fourth insulating layer 311 may expose upper surfaces of the through electrodes 500. Thereafter, the process described with reference to FIGS. 6 to 12 may be performed on the fourth insulating layer 311 to form the second redistribution substrate 300. Accordingly, a lower package 11 may be fabricated.

Figure 16:
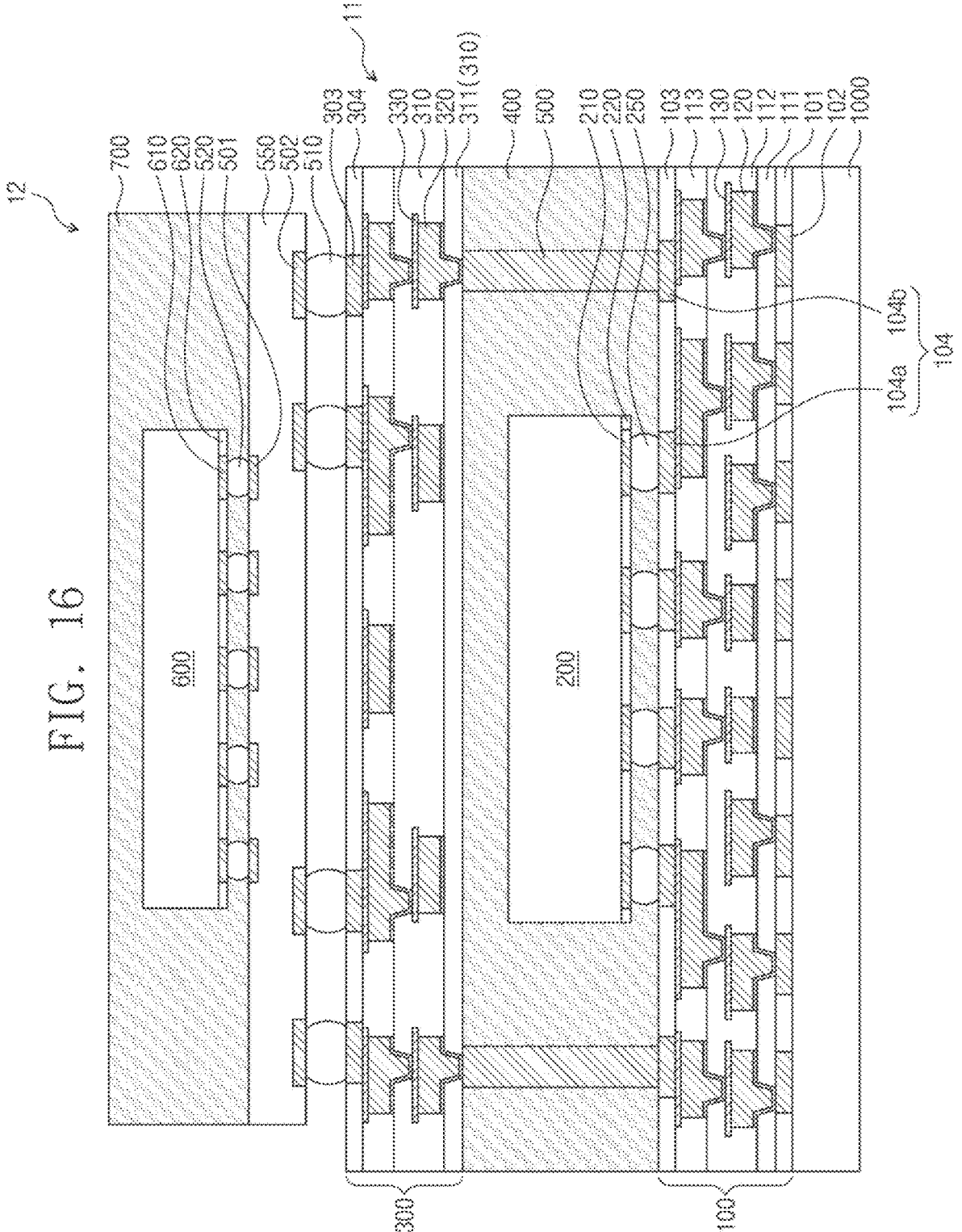

Referring to FIG. 16, an upper package 12 may be provided on the lower package 11. A second semiconductor chip 600 may be flip-chip bonded on an upper substrate 550. For example, after providing a second chip connection terminal 520 on a second chip pad 610 of a second semiconductor chip 600, the second semiconductor chip 600 may be disposed on an upper substrate 550 to align a first substrate pad 501 of the upper substrate 550 to a second chip connection terminal 520. Thereafter, a reflow process may be performed on the second chip connection terminal 520 to mount the second semiconductor chip 600 on the upper substrate 550.

A second molding layer 700 may be formed on the upper substrate 550. The second molding layer 700 may cover the second semiconductor chip 600 on an upper surface of the upper substrate 550. Accordingly, the upper package 12 may be fabricated.

The upper package 12 may be mounted on the lower package 11. After the upper package 12 provides the substrate connection terminal 510 on the second substrate pad 502 of the upper substrate 550, the substrate connection terminal 510 may be disposed on the lower package 11 to be aligned with the third redistribution pad 303 of the second redistribution substrate 300. Thereafter, the upper package 12 may be mounted on the lower package 11 by performing a reflow process on the substrate connection terminal 510.

Referring back to FIGS. 3 and 5, the carrier substrate 1000 may be removed from the first redistribution substrate 100. At this time, lower surfaces of the first redistribution pads 102 may be exposed. External connection terminals 140 may be provided on the lower surfaces of the first redistribution pads 102. Accordingly, the semiconductor package 10 may be fabricated.

In the redistribution substrate according to some example embodiments, the metal layer covering the upper surface of the wiring pattern may be provided in the insulating layer. The metal layer may be provided to have the width wider than the width of the wiring pattern to prevent cracks from being formed between the wiring pattern and the insulating layer. In addition, the metal layer may prevent the by-products caused by the insulating layer and the wiring pattern. Accordingly, the structural stability and reliability of the redistribution substrate and the semiconductor package including the same may be improved.

While various example embodiments are described above, a person skilled in the art may understand that many modifications and variations may be made without departing from the spirit and scope of the present disclosure defined in the following claims. Accordingly, the various example embodiments should be considered in all respects as illustrative and not restrictive, with the spirit and scope of the present disclosure being indicated by the appended claims.

What is claimed is:

1. A redistribution substrate comprising:
a first insulating layer;
a wiring pattern including a via portion penetrating the first insulating layer and a pad portion on the via portion, the pad portion extending onto an upper surface of the first insulating layer;
a metal layer covering an upper surface of the wiring pattern; and
a second insulating layer on the first insulating layer, the second insulating layer covering the pad portion and the metal layer,
wherein the wiring pattern includes a first metal,
wherein the metal layer includes the first metal and a second metal,
wherein the metal layer includes:
a first portion vertically overlapping the pad portion; and
a second portion surrounding the first portion, and
wherein a concentration of the first metal in the first portion of the metal layer is greater than a concentration of the first metal in the second portion of the metal layer.

2. The redistribution substrate of claim 1, wherein a width of the metal layer is greater than a width of the pad portion.

3. The redistribution substrate of claim 1, wherein the concentration of the first metal in the first portion of the metal layer decreases as a distance from an interface between the metal layer and the pad portion increases.

4. The redistribution substrate of claim 1, wherein a portion of the metal layer adjacent to an upper surface of the metal layer and adjacent to side surfaces of the metal layer does not include the first metal.

5. The redistribution substrate of claim 1, wherein a thickness of the metal layer is smaller than a thickness of the pad portion.

6. The redistribution substrate of claim 1, wherein the metal layer has a thickness of 300 Å to 1500 Å.

7. The redistribution substrate of claim 1, wherein the first metal includes copper (Cu), and
wherein the second metal includes nickel (Ni).

8. The redistribution substrate of claim 1, wherein a width of the via portion increases as a distance from the pad portion decreases, and
wherein a width of the pad portion is greater than a maximum width of the via portion.

9. A semiconductor package comprising:
a first redistribution substrate;
a semiconductor chip mounted on the first redistribution substrate; and
a molding layer on an upper surface of the first redistribution substrate and covering the semiconductor chip,
wherein the first redistribution substrate includes:
a first insulating layer;
a wiring pattern including a via portion penetrating the first insulating layer and a pad portion on the via portion, the pad portion extending onto an upper surface of the first insulating layer;

a metal layer covering an upper surface of the wiring pattern; and a second insulating layer on the first insulating layer, the second insulating layer covering the pad portion and the metal layer, wherein a width of the metal layer is greater than a width of the pad portion, and wherein a thickness of the metal layer is 300 Å to 1500 Å.

10. The semiconductor package of claim 9, wherein the metal layer includes a first metal and a second metal, wherein the first metal includes copper, and wherein the second metal includes nickel.

11. The semiconductor package of claim 10, wherein the metal layer includes:

a first portion vertically overlapping the pad portion; and a second portion that does not vertically overlap the pad portion, wherein a concentration of the first metal in the first portion of the metal layer is greater than a concentration of the first metal in the second portion of the metal layer.

12. The semiconductor package of claim 10, wherein a concentration of the first metal in the metal layer decreases as a distance from an interface between the metal layer and the pad portion increases.

13. The semiconductor package of claim 9, wherein a width of the via portion increases as a distance from the pad portion decreases, wherein a width of the pad portion is greater than a maximum width of the via portion.

14. The semiconductor package of claim 9, wherein the metal layer is in contact with an entire upper surface of the wiring pattern.

\* \* \* \* \*